United States Patent
Dedieu et al.

(10) Patent No.: US 7,501,899 B2
(45) Date of Patent: Mar. 10, 2009

(54) METHOD AND DEVICE FOR GENERATING A SIGNAL BY FRACTIONAL FREQUENCY LOCKED LOOP

(75) Inventors: Sébastien Dedieu, Crolles (FR); Marc Houdebine, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 631 days.

(21) Appl. No.: 11/312,127

(22) Filed: Dec. 20, 2005

(65) Prior Publication Data
US 2006/0154616 A1 Jul. 13, 2006

(30) Foreign Application Priority Data
Dec. 20, 2004 (FR) .................................. 04 13596

(51) Int. Cl.
*H03L 7/00* (2006.01)
(52) U.S. Cl. .............................. 331/16; 331/17; 331/34; 331/177 R; 327/156
(58) Field of Classification Search .................... 331/16, 331/17, 34, 177 R; 327/156
See application file for complete search history.

(56) References Cited

U.S. PATENT DOCUMENTS

| 4,179,670 | A | 12/1979 | Kingsbury .................... 331/10 |
| 6,914,458 | B2 * | 7/2005 | Joet et al. .................... 327/116 |
| 7,123,102 | B2 * | 10/2006 | Uozumi et al. ................. 331/34 |
| 7,274,229 | B1 * | 9/2007 | Humphreys et al. ......... 327/156 |
| 2001/0038314 | A1 | 11/2001 | Ichimaru ...................... 331/10 |
| 2004/0113665 | A1 | 6/2004 | Joet et al. .................... 327/156 |

OTHER PUBLICATIONS

"Static Fractional-N: The True Fractional Division Method of Indirect Synthesis", Stanislaw Alechno, Microwave Journal, Horizon House-Microwave, Norwood, MA, US, vol. No. 40, No. 5, May 1997, pp. 318, 320, 322I, XP000737306; ISSN: 0192-6225.

* cited by examiner

*Primary Examiner*—Arnold Kinkead
(74) *Attorney, Agent, or Firm*—Lisa K. Jorgenson; Allen, Dyer, Doppelt, Milbrath & Gilchrist, P.A.

(57) ABSTRACT

A method in accordance with the invention may include a cyclical succession of measurement phases and of correction phases. The correction phase may include a deactivation of a frequency divider and a correction of the control of an oscillator on the basis of the error signal, with the output signal from the oscillator forming the desired signal.

24 Claims, 8 Drawing Sheets

METHOD AND DEVICE FOR GENERATING A SIGNAL BY FRACTIONAL FREQUENCY LOCKED LOOP

FIELD OF THE INVENTION

The invention relates to frequency synthesis and applies advantageously, but not limitingly to, the field of wireless communication, and, in particular to mobile telephones which incorporate frequency synthesizer or synthesis means into their transmission/reception chain. This circuit is also applicable to Digital Terrestrial Television.

BACKGROUND OF THE INVENTION

A phase locked loop (PLL) is often used for frequency synthesis. Specifically, a feedback system such as this makes it possible to multiply a reference frequency by an integer number and thus address a whole span of frequencies with a certain frequency interval. More precisely, a phase locked loop is a feedback control system which generates a frequency that is N times larger than the reference frequency that it receives as input, with N being an integer. Thus, the output frequency, which is given by a voltage-controlled oscillator, is divided by N, and then compared with a reference that may be provided by a quartz crystal. A charge pump, formed of two current sources, then reacts by injecting current into or withdrawing it from the integrating filter that drives the output oscillator.

In the case where the output frequency of the oscillator is an increasing function of its input voltage, the reaction of the loop is based on the following principle. The edge comparator detects the first of the two edges. If this detected edge belongs to the reference signal, the charge pump receives the order to dispatch current into the integrating filter. Specifically, in this case, the output signal, divided by N, lags behind the reference signal and it is therefore necessary to increase the voltage across the terminals of the oscillator.

Conversely, if the first edge detected is that of the output signal divided by N, then the charge pump absorbs current so that the voltage across the terminals of the oscillator drops. On the appearance of the second edge, the charge pump stops its activity while waiting for the next edge. Thus, the closer together the edges, the smaller the charge injected until the frequency of the output signal of the oscillator converges to N times the reference frequency.

Phase locked loops make it possible to synthesize frequencies with high accuracy and high stability. Their limitation stems from the fact that only the synthesis of integer multiples is possible, thereby limiting the number of frequencies that can be addressed on the basis of a single reference frequency.

To alleviate the problem of non-integer division, it is possible to use a so-called "fractional" phase locked loop for performing a succession of divisions by N and N+1. Thus, to perform a division by N+0.5, we divide once by N, once by N+1 and so on and so forth. The integrating filter of the loop then averages the value of the voltage driving the output oscillator of the loop.

This type of architecture, which solves the problem of decimal part division, nevertheless raises big noise problems. Specifically, unlike the conventional phase locked loops mentioned above, in which the injections of current decrease until they become negligible in the steady state, fractional phase locked loops retain large injections of current throughout their operation, since the frequency lies between N and N+1 times the reference frequency, and since it can be compared only with integer divisions.

These repeated injections of current give rise to noise that has to be apportioned. Additionally, it is the size of the binary sequence controlling the divider by N or N+1 that will impose this apportionment.

When the sequence is minimum, the voltage of the oscillator is modulated at the frequency of communication of the dividers by N and N+1. The output spectrum of the loop then comprises two parasitic lines. Additionally, these lines may render the circuit inoperative if they do not comply with the specifications regarding the noise around the fundamental.

Moreover, when the sequence gets larger, the parasitic lines, due to the period of the sequence, tend to spread out. However, the integrating filter of the loop then has time to react, thus giving rise to a variation of the fundamental over time. Thus, for very long sequences, the parasitic lines are akin to noise apportioned about the frequency generated, on account of undesired modulation of the output frequency.

In conclusion, the choice of the cut-off frequency of the phase locked loop will be a compromise limiting the filtering of the parasitic lines (ideally low in frequency) and that of the noise of the voltage-controlled oscillator (ideally high in frequency).

Document FR A 2 846 164 proposes the generation of a frequency signal equal to the product of a reference frequency times a real number by means of two dividers and two comparison signals. The system is therefore complex. It turns out to be desirable to further optimize the noise generated.

SUMMARY OF THE INVENTION

An object of the invention is to address the above and other limitations associated with the prior art.

An object of the invention is to provide a frequency synthesis that may preserve the advantages of conventional locked loops while reducing the noise inherent in fractional phase locked loops. The invention may provide a stable frequency synthesis allowing a high frequency with small frequency intervals and reduced noise. The invention therefore may provide a method of generating a desired signal having a desired frequency equal to the product of a reference frequency times a real number, with low noise.

According to an embodiment of the invention, the method may comprise cyclically a succession of a measurement phase and of a correction phase. The measurement phase may comprise an integer division of the frequency of the output signal of an oscillator by an integer divider so as to obtain an intermediate signal, a determination of measurement signals representative of the time mismatch between the intermediate signal and a reference signal having the reference frequency, a transfer of electric charges dependent on the reference period, on the integer part and on the decimal part of the real number, so as to obtain an error signal representative of the time mismatch between the period of the current output signal of the oscillator and the desired period. The desired frequency may be obtained and may be measurable in the steady state.

The correction phase may comprise a deactivation of the frequency divider and a correction of the control of the oscillator on the basis of the error signal, with the output signal from the oscillator forming the desired signal. The output signal from the oscillator may form the output signal of the frequency synthesizer in the steady state.

In other words, in a general manner, the measurement phase may be performed adjacent the minimum by using an integer division time mismatch measurement loop, this loop being open upstream of the voltage-controlled oscillator. Thus, in the course of a measurement period, which is for example greater than a period of the reference signal, the phase of the reference frequency may be compared with the phase of an intermediate signal obtained by dividing the output frequency by the integer part of the requested division factor. On the basis of the phase comparison, signals for controlling the transfer of charges for charging a capacitor with a charge representative of the result of the comparison of phases may be determined. During the correction phase, the transfer of charges may be deactivated and the charge stored may be transferred to the input of an integrator whose output voltage controls the oscillator.

The invention thus may make it possible to ascertain the mismatch between the output frequency and the desired frequency and the loop may react to the real mismatch leading to stability of the loop as well as to the absence of parasitic lines inherent in conventional fractional phase locked loops. When the measurement phase is performed during more than one period of the reference signal, the correction phase may then be performed during the remainder of the period of the reference signal, and so on and so forth.

In an embodiment of the invention, the cycle comprising a measurement phase and a correction phase may be performed over an integer number of periods of the reference signal, for example two periods. Advantageously, the correction phase may also comprise a deactivation of the charge transfer arising from an electric charge transfer unit or means of transferring electric charges. The operating stability may thus be improved.

In an embodiment of the invention, the measurement signals may successively instruct three transfers of electric charges, one of the transfers taking place over a duration which may be a multiple of the period of the output signal, the other transfers taking place over a duration dependent on the time mismatch between the period of the current output signal of the oscillator and the desired period, with the electric current being of fixed value and depending on the decimal part of the real number.

The transfers of charges may be synchronized with the output frequency of the oscillator. Quiescent times between the transfers of charges may be provided for. The transfers of charges may be set up with substantially identical edges which mutually compensate one another, and hence increased accuracy.

Advantageously, a transfer of electric charges corresponding to the decimal part of the real number may be implemented in the course of the measurement phase. This may allow a time saving with respect to the correction.

In an embodiment of the invention, an oscillator correction voltage may be generated on the basis of the charges transferred and stored. The object of the invention may also be a device for generating a desired signal having a desired frequency equal to the product of a reference frequency times a real number.

According to the invention, the device may comprise a controlled oscillator, and a divider unit or means of division able to perform an integer division of the frequency of the output signal of the voltage-controlled oscillator by an integer divider so as to obtain a first intermediate signal. The device may also comprise a determination unit or means of determination able to determine signals representative of the time mismatch between this first intermediate signal and a reference signal having the reference frequency, and a transfer unit or means of transfer of electric charges controlled by the output signals of the determination unit or means of determination. The device may further comprise a sampler/integrator connected to the output of the transfer unit or means of transfer of electric charges, and to the control input of the oscillator, and a controller or means of control able to control the sampler/integrator, to deactivate the divider and to control the determination unit or means of determination, in such a way as to allow successively the determination of the error signal and the delivery of this error signal on the control input of the oscillator, the output signal of the oscillator forming the desired signal, especially in the steady state.

In an embodiment of the invention, the sampler/integrator may comprise a storage unit or means of storage of electric charges transferred by the transfer unit or means of transfer of electric charges, a switch connected to the output of the transfer unit or means of transfer of electric charges, and an integrator connected to the output of the switch and the control input of the oscillator. The storage unit or means of storing electric charges may comprise a capacitor, a terminal of which is linked to the output of the transfer unit or means of transfer of electric charges and the other terminal of which is linked to a mid-point voltage. The switch may be controlled by the controller or control means. The integrator may comprise an amplifier and a capacitor mounted between an input and an output of the amplifier.

In an embodiment of the invention, the controller or control means may be able to open and to close the switch successively and cyclically. In an embodiment of the invention, the determination unit or means of determination may be synchronized with the reference frequency.

In an embodiment of the invention, the transfer unit or means of transfer of electric charges may comprise a first current source $\alpha I$, a second current source $\beta I$, and a third current source $\gamma I$, that may be controlled by three output signals from the determination unit or means of determination. Advantageously, $\alpha$ and $\gamma$ may be equal absolute values of opposite signs. Any errors in the setup times of $\alpha I$ and of $\gamma I$ my compensate for one another resulting in very accurate operation. The delays and the setup times of the currents $\alpha I$ and $\gamma I$ may compensate for one another.

On the other hand, any error in the value of the currents $\alpha I$ and $\gamma I$ may impair the output spectrum since there will then be different error charges "Q". To avoid this problem, the amplifier may make it possible to maintain the output voltage of the transfer unit or means of transfer of electric charges around the same potential, which may be a mid-point, thereby optimizing its operation. $\alpha$ may be equal to 1 or $-1$, $\beta$ may be equal to $-f$ or $+f$, $\gamma$ may be equal to $-1$ or 1 respectively, with f the fractional part of the real number R.

In an embodiment of the invention, the second current source may comprise a programmable analogue/digital converter. In other words, the second current source may comprise a plurality of mini current pumps in parallel.

In an embodiment of the invention, in the steady state the first current source may be active during at least two periods of the output frequency, the second current source may be active during a period of the output frequency, and the third current source may be active between the reference edge and the Nth edge of the output signal counting from the ceasing of injection of the first current $\alpha I$.

In an embodiment of the invention, the device may be embodied in the form of an integrated circuit. The invention may also be aimed at a terminal of a wireless communication system comprising a generating device as defined hereinabove. This terminal may for example be a cellular mobile telephone, or a digital terrestrial television element. Relative to conventional fractional phase locked loops, the system may allow a simpler architecture that is able to be devoid of any modulator for selecting the outputs of the dividers by N, N+1, etc, able to comprise a single divider in the return chain, having a reduced digital part, exhibiting low consumption of current, and provided with small size components, in particular capacitors, and hence the possibility of embodying the capacitors in integrated technology.

Moreover, the system may exhibit numerous advantages. The determination unit or means of determination and the transfer unit or means of transfer of electric charges may operate sequentially, thereby making it possible to avoid dead areas. The measurement system and the resetting of the divider by N to zero may make it possible to avoid the need to resynchronize the system. If the current βI is wrong with respect to the integer value αI and γI, this does may not create any noise at the output, but only a frequency offset that may be recorrected by modifying the value of the factor f that is programmed into the digital/analogue converter, in so far as the error in the current βI is constant. Moreover, the fractional part may make it possible to perform a calibration of the system. Any error in current between αI and γI may be reduced by virtue of the output voltage of the transfer unit or means of transfer of electric charges whose charge pumps may be maintained around a constant potential, typically half the supply voltage, by virtue of the amplifier. It may be beneficial to fix the voltage of the capacitor disposed between the output of the transfer unit or means of transfer of electric charges and the switch within an operating span where the absolute values of the currents of the charge pumps affording the current αI and γI may be equal. It may also be possible to resort to negative feedback to improve the equality of the absolute values of the currents as a function of the output potential of the transfer unit or means of transfer of electric charges.

BRIEF DESCRIPTION OF THE DRAWINGS

Other advantages and characteristics of the invention may become apparent on examining the detailed description of an embodiment and a mode of implementation, which are in no way limiting, and the appended drawings in which.

DETAILED DESCRIPTION OF THE PREFERRED EMBODIMENTS

Figure 1:
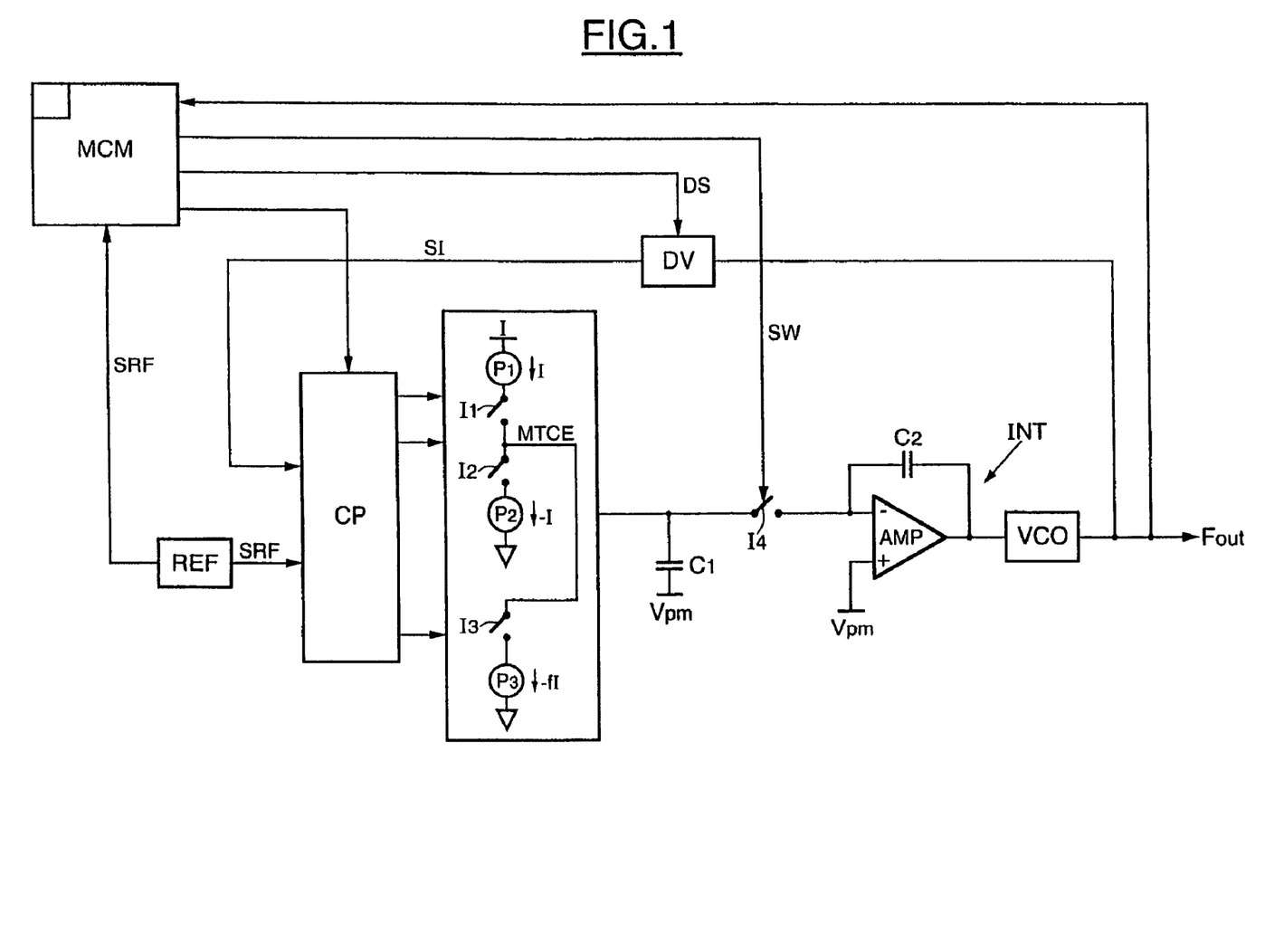
FIG. 1 is a schematic block diagram of a frequency synthesizer device in accordance with the invention.

Referring initially to FIG. 1, an embodiment of a frequency synthesizer device is represented. This device comprises a voltage-controlled oscillator VCO whose output delivers the desired output signal, in this instance the signal $F_{out}$. Although a voltage-controlled oscillator has been represented here, any type of controlled oscillator is suitable, for example a current-controlled oscillator.

The frequency synthesizer device comprises a divider DV capable of performing an integer division, in this instance by N, of the output signal delivered by the oscillator VCO. The divider DV can consist of a counter up to N. This first intermediate signal SI, delivered by the divider DV is provided to determination unit or means of determination CP. Furthermore, the divider DV may be activated or deactivated by a logic signal DS delivered by the controller or control means MCM. Moreover, the determination unit or means of determination CP receives a reference signal SRF, having a reference period $T_{ref}$. This reference signal SRF is delivered by a reference element REF, for example, a frequency loop or a quartz crystal. The output of the determination unit or means of determination CP is linked to a transfer unit or means of transfer of electric charges MTCE comprising, here, three charge pumps $P_1$, $P_2$ and $P_3$ that can be actuated by switches $I_1$, $I_2$ and $I_3$, respectively, whose control terminals are linked to the determination unit or means of determination CP. The charge pump $P_3$ can comprise one or more analogue/digital converters, for example.

A first capacitor $C_1$ is connected between a voltage midpoint $V_{pm}$ and the output of the transfer unit or means of transfer of electric charges MTCE. The voltage $V_{pm}$ is equal to half the sum of the voltage of the earth and the supply voltage of the device.

The output of the transfer unit or means of transfer of electric charges MTCE is linked to a switch $I_4$ controlled by a control signal emitted by the controller or control means MCM. The output of the switch $I_4$ is linked to an integrator INT provided with an amplifier AMP and with a capacitor $C_2$ mounted between the inverting input and the output of the amplifier AMP. The non-inverting input of the capacitor $C_2$ is linked to a voltage mid-point $V_{pm}$. The output of the amplifier AMP forms the output of the integrator INT and is linked to the oscillator VCO.

The frequency synthesizer device may be embodied in the form of an integrated circuit which makes it possible to perform directly a division by a real number R having a decimal part of several bits, in this instance by a number equal to N+f where N designates the integer part of the real divisor and f the decimal part. The invention is therefore distinguished from the prior art, and in particular from fractional locked loop systems that make provision to perform two integer divisions alternately. Specifically, according to the embodiment illustrated, the reference frequency is compared with the desired frequency divided by N. The mismatch decreases until it becomes negligible. The loop remains stable and the parasitic lines inherent in conventional fractional phase locked loops disappear.

Figure 2:
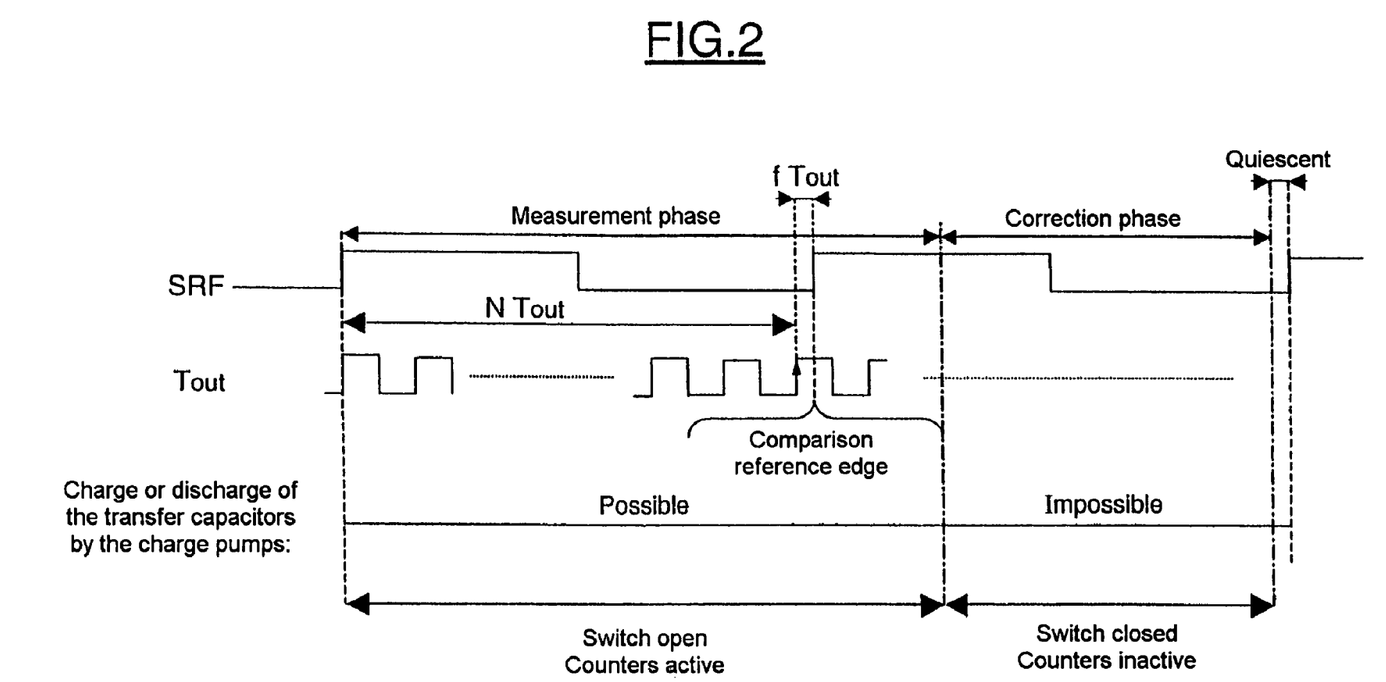
FIGS. 2 through 6 are timing charts illustrating the operation of the device shown in FIG. 1.

More precisely, the method of frequency synthesis is spread out over two phases, namely a measurement phase and a correction phase, see FIG. 2. The correction unit or means of correction is disabled during the measurement phase and the measurement unit or measurement means is disabled during the correction phase, so that any disturbances of the correction on the measurement and of the measurement on the correction are reduced as far as possible.

The measurement phase may be performed over a period and a half of the reference signal SRF or more. This measurement period is used to perform the measurement of the output frequency $F_{out}$. During this time, the switch $I_4$ is open, just before the integrator INT maintaining the control voltage of the oscillator, so as to prevent the feedback of the loop from disturbing the measurement. The divider DV activated by the signal DS emitted by the controller or control means MCM provides the intermediate signal SI with a frequency equal to the quotient of the output frequency $F_{out}$ by N.

The determination unit or means of determination CP receives an activation signal originating from the controller or control means MCM and performs a phase comparison between the reference signal SRF and the intermediate signal SI. Depending on the phase comparison, the determination unit or means of determination CP formulates the control signals for the switches $I_1$, $I_2$, and $I_3$ of the transfer unit or means of transfer of electric charges MTCE, so that at least two of the switches $I_1$, $I_2$, and $I_3$ are simultaneously open. The determination unit or means of determination CP are synchronized with the reference signal SRF.

Figure 3:
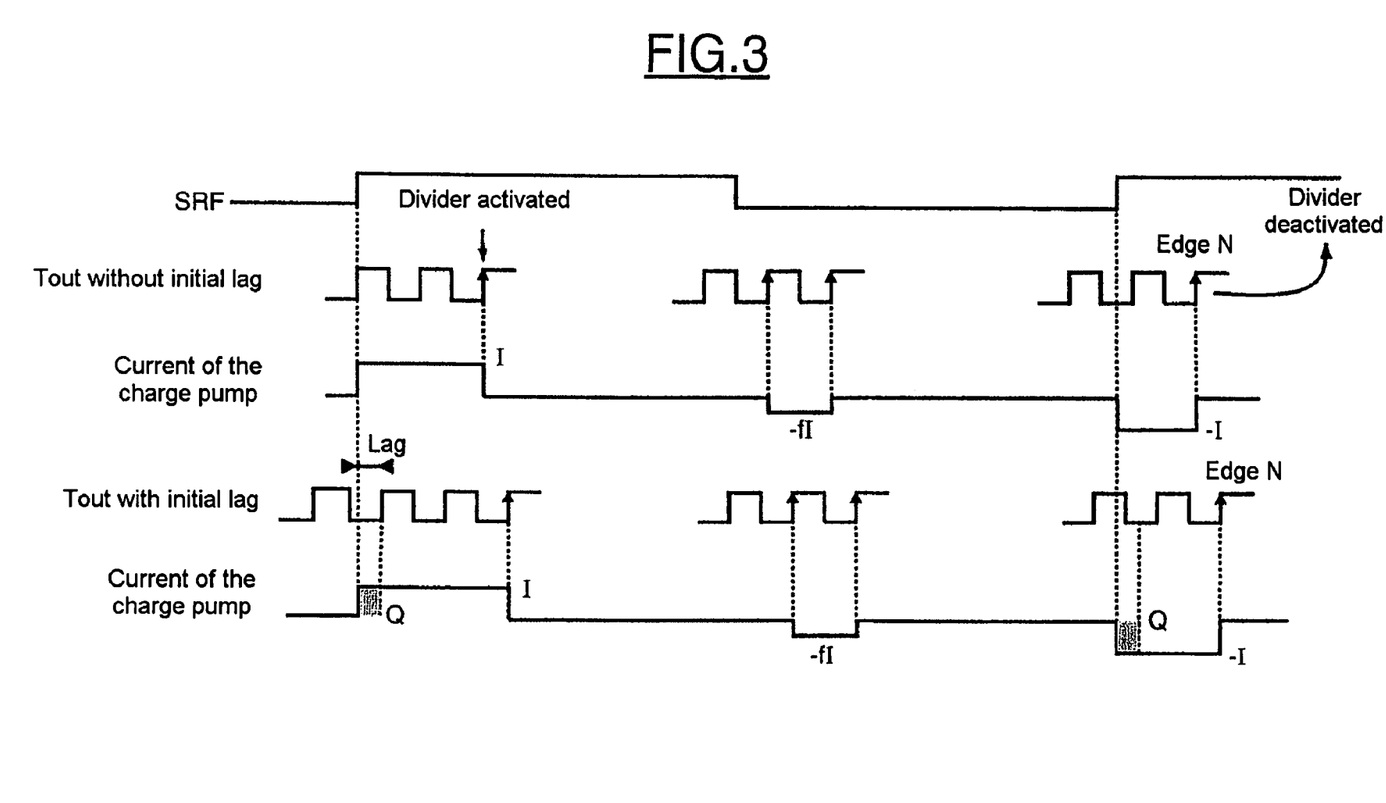
Figure 4:
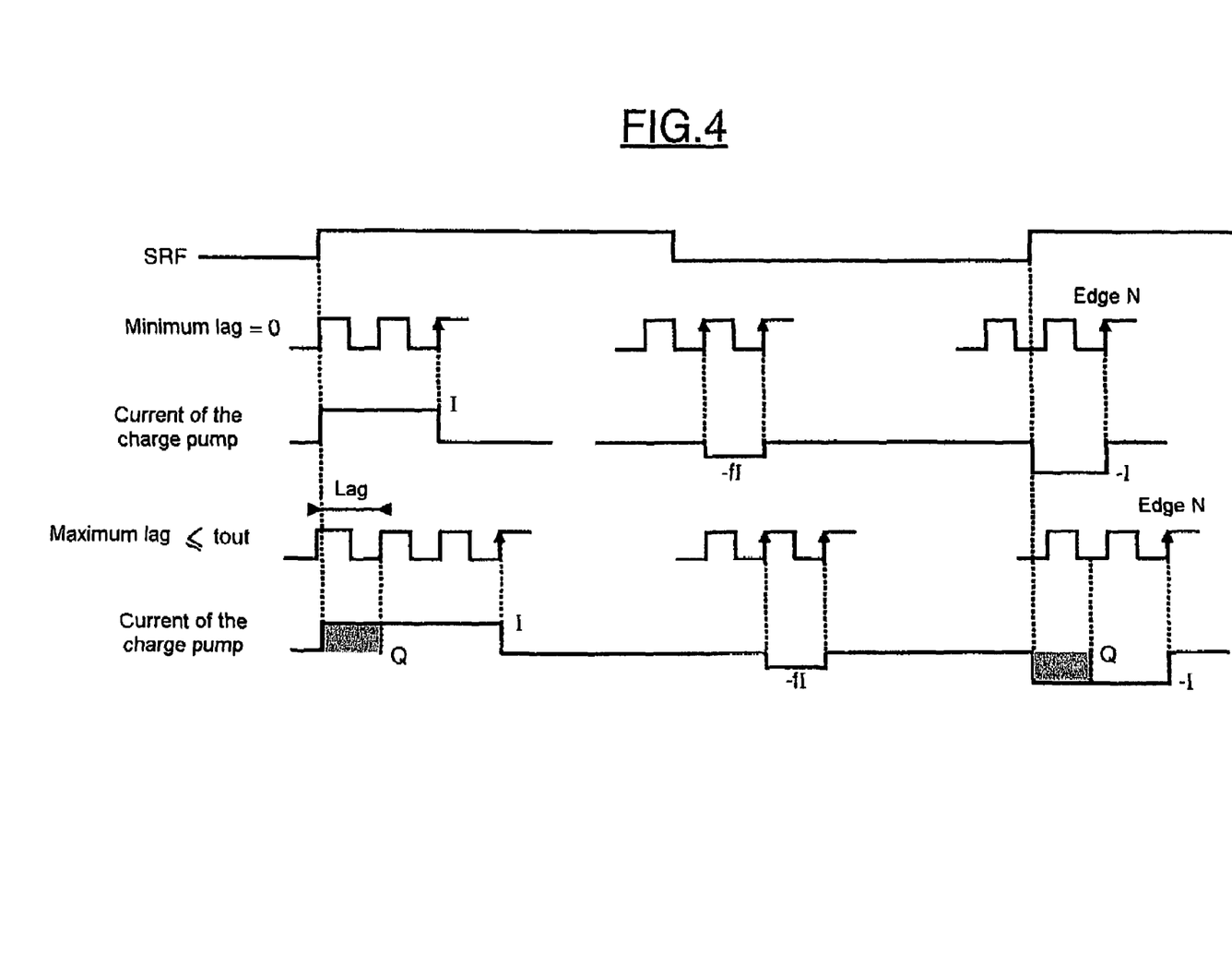

In the example illustrated in FIG. 3, the switch $I_1$, controlling the charge pump $P_1$ of current $+I$ is closed during at least two periods of the signal $F_{out}$, starting from the beginning of the measurement period as given by a rising edge of the signal SRF and up to a rising edge of the signal $F_{out}$. The duration of injection of the current $+I$ is equal to $(2+f_1)T_{out}$, with f1 a lag lying between 0 and 1 as a function of the offset between the signals SRF and $F_{out}$, this translating into the injection of an additional charge $Q_1=+If_1$.

The switch $I_3$ controlling the charge pump $P_3$ of current $-fI$ is closed during a period $T_{out}$ of the signal $F_{out}$, starting from the first downward transition of the reference signal $S_{ref}$ during the measurement period. The switch $I_2$ controlling the charge pump $P_2$ of current $-I$ is closed starting from the first upward transition of the reference signal SRF following the opening of the switch $I_3$ during the measurement period and open starting from the Nth rising edge of the output signal counting from the edge triggering the opening of the switch $I_1$. In the steady state, the switch $I_2$ is closed for a duration $(2-f+f_1)T_{out}$ with f the decimal part of the division factor R and $f_1$ the initial lag between the first reference rising edge and the first output rising edge at the beginning of the measurement phase.

At the end of the measurement period, three transfers of charges have taken place from the charge pumps $P_1$, $P_3$ and $P_2$ to the capacitor $C_1$. The duration of the first and third transfers depend on the offset between the signals $F_{out}$ and SRF. The duration of the second transfer depends preferably only on the period of the output signal.

The voltage across the terminals of the capacitor $C_1$ is conserved if $(N+f)T_{out}$ is equal to $T_{ref}$, the sum of the currents weighted by the durations, which may be written $(2+f_1-f-(2+f_3))$, being zero. The currents I, fI and $-I$ of the charge pumps are fixed permanently by the programming of the charge pumps. On the other hand, in the event of an offset at the start of the measurement period between the rising edge of SRF and the rising edge of $F_{out}$ which exhibits a delay $\delta \times T_{out}$ with $\delta$ lying strictly between 0 and 1, the charge pump $P_1$ injects a further charge equal to $I\delta T_{out}$ additional to the expected charges of $2IT_{out}$: $Q_1=+I(2+\delta)T_{out}$. This offset induced by the non-integer division factor between the output signal and the reference SRF will correspondingly delay the edge of the intermediate signal SI. This delay in the turning on of $I_2$ injects a further charge equal to $-I\delta T_{out}$ with expected charges of $-(2-f)IT_{out}$ i.e. $Q_3=-I(2-f+\delta)T_{out}$. The error due to the delay of the signals in the charges $Q_1$ and $Q_3$ is neutralized for each measurement phase:

$$\Delta Q = Q_1 + Q_3 = +I(2+\delta)T_{out} - I(2-f+\delta)T_{out} = +fIT_{out}$$

The cyclic phase shift between the signals SRF and $F_{out}$ remains inoperative in regard to the operation of the frequency synthesizer device. The quantity $\Delta Q$ is proportional to the decimal part f of the real number R.

Figure 5:
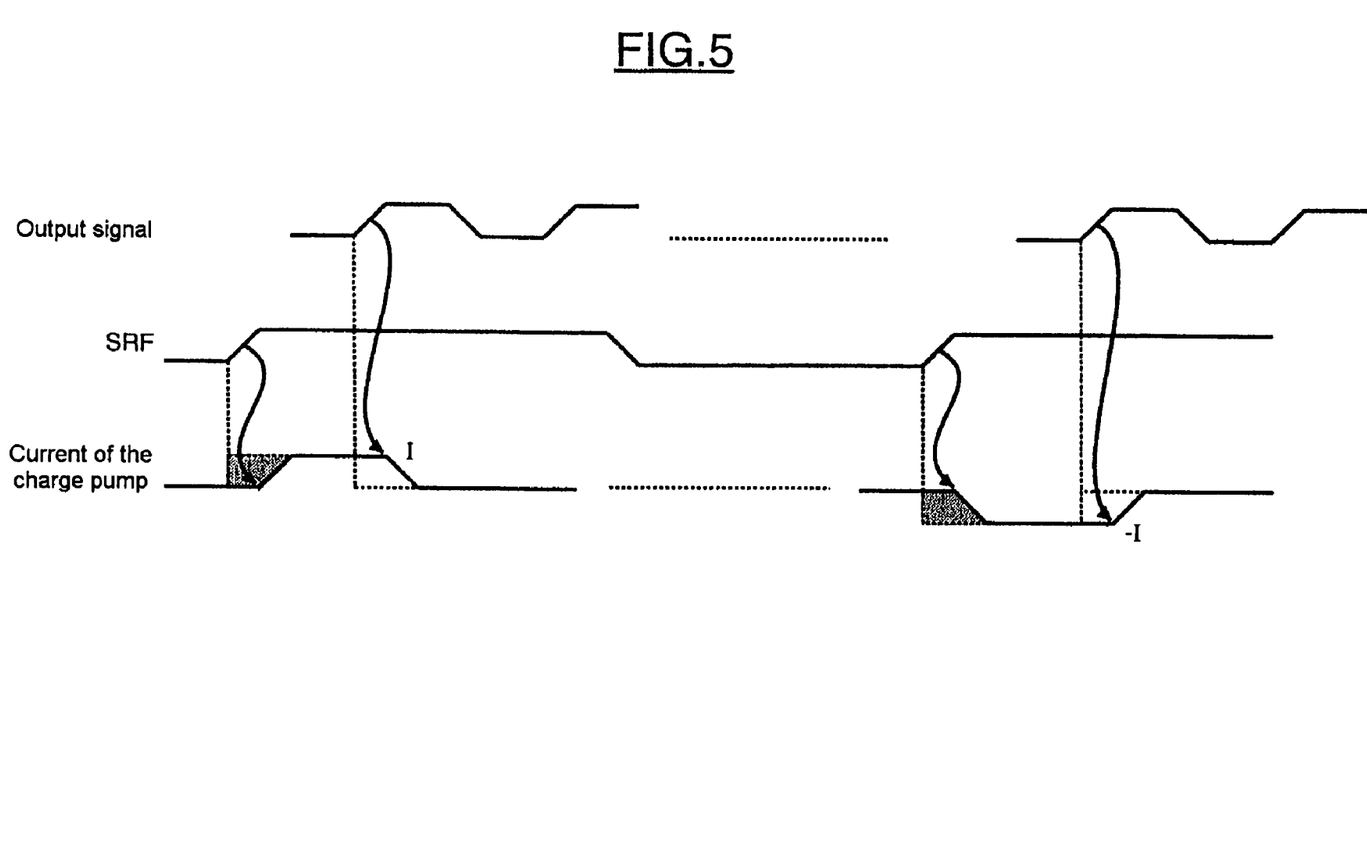
Figure 6:
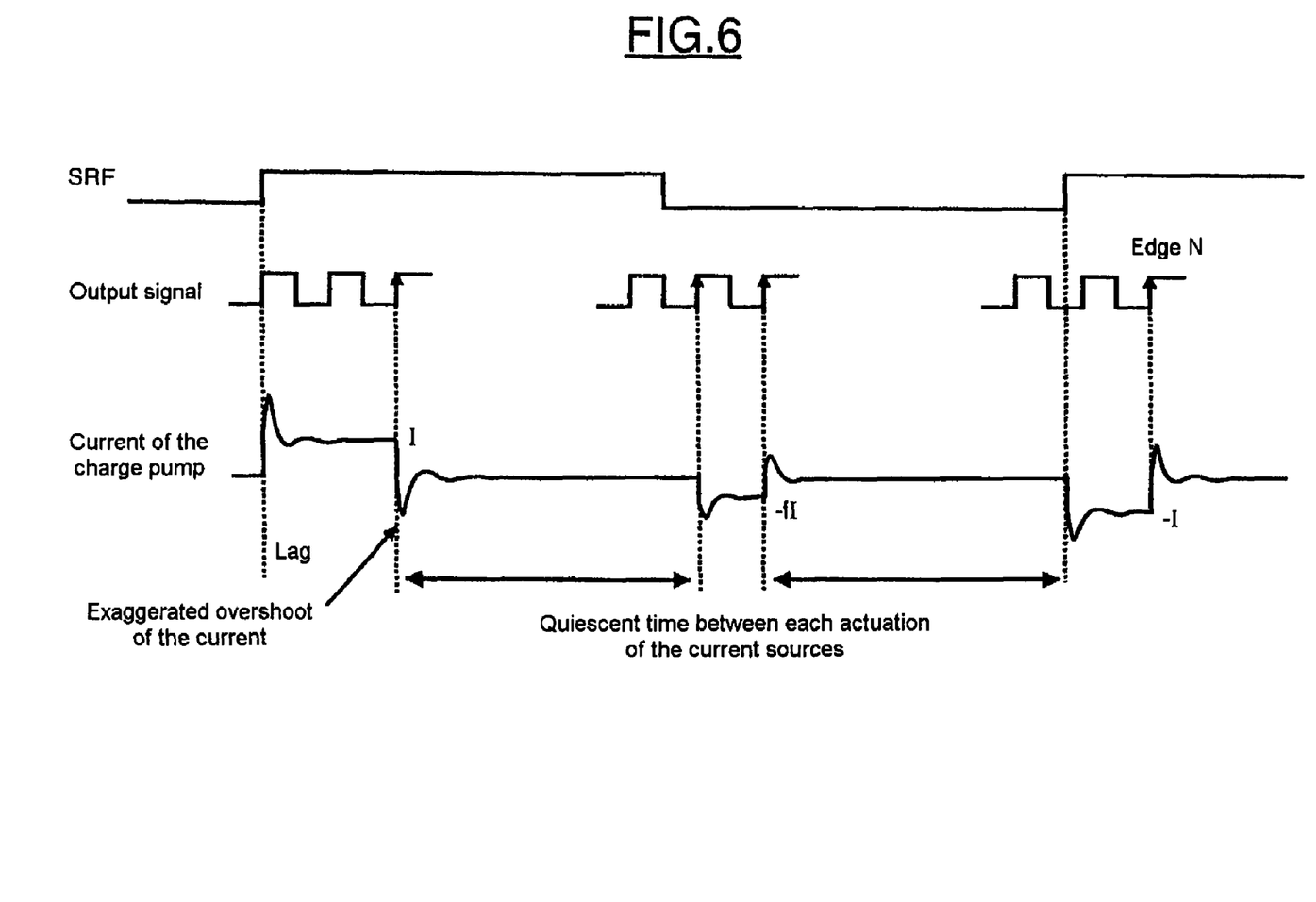

Furthermore, the durations of injection of the currents are greater than or equal to the period $T_{out}$ of the output signal $F_{out}$, thereby making it possible to greatly reduce the influence of any transients in the setup of the current on account, on the one hand, of the mutual neutralization of the transients in the setup of the currents I and $-I$ which exhibits similar shapes on account of the symmetry of the components and of the duration of injection that is markedly greater than that of the transients, see FIG. 5, and on the other hand, of the charge transmitted which is sufficient to be rather insensitive to the current setup transients. A quiescent time at least equal to a period $T_{out}$ of the output signal $F_{out}$ is envisaged between a turning on of one of the switches and the subsequent turning off of another of the switches, thereby making it possible for the transients when turning on a switch to occur well before the subsequent turning off of another of the switches, see FIG. 6. The influence of the turn-on transients of the switches on the subsequent actuation of a charge pump is thus greatly reduced.

During the subsequent period, we then proceed to the correction phase. The frequency divider DV is deactivated and reset to zero and the switch $I_4$ is closed. The switches $I_1$, $I_2$ and $I_3$ are open thereby prohibiting action of the charge pumps on the transfer capacitors. The variation in voltage V obtained at the output of the amplifier AMP resulting from the transfer of charges from the capacitor $C_1$ to the capacitor $C_2$ gives the mismatch between the output frequency and the desired frequency for small values of phase shift only. For too large an output frequency, the edge N of the SI arrives before the edge of SRF. In this case, the amount of charge accumulated in $C_1$ is: $I(2+\delta)T_{out} - fIT_{out}$. In other words, the "transfer function" between the phase shift and the voltage across the terminals of $C_1$ is saturated.

$$\Delta V = \frac{2k}{C_2}[(N+f)T_{out} - T_{ref}]$$

with k a real number. The mismatch between the desired period and the current period is therefore available. Before recommencing the measurement, that is to say in the course of an integer number of subsequent periods of the reference signal (for example in the course of the next period), the counters will be activated at the next edge of the reference signal followed by two rising edges of $F_{out}$.

Figure 7:
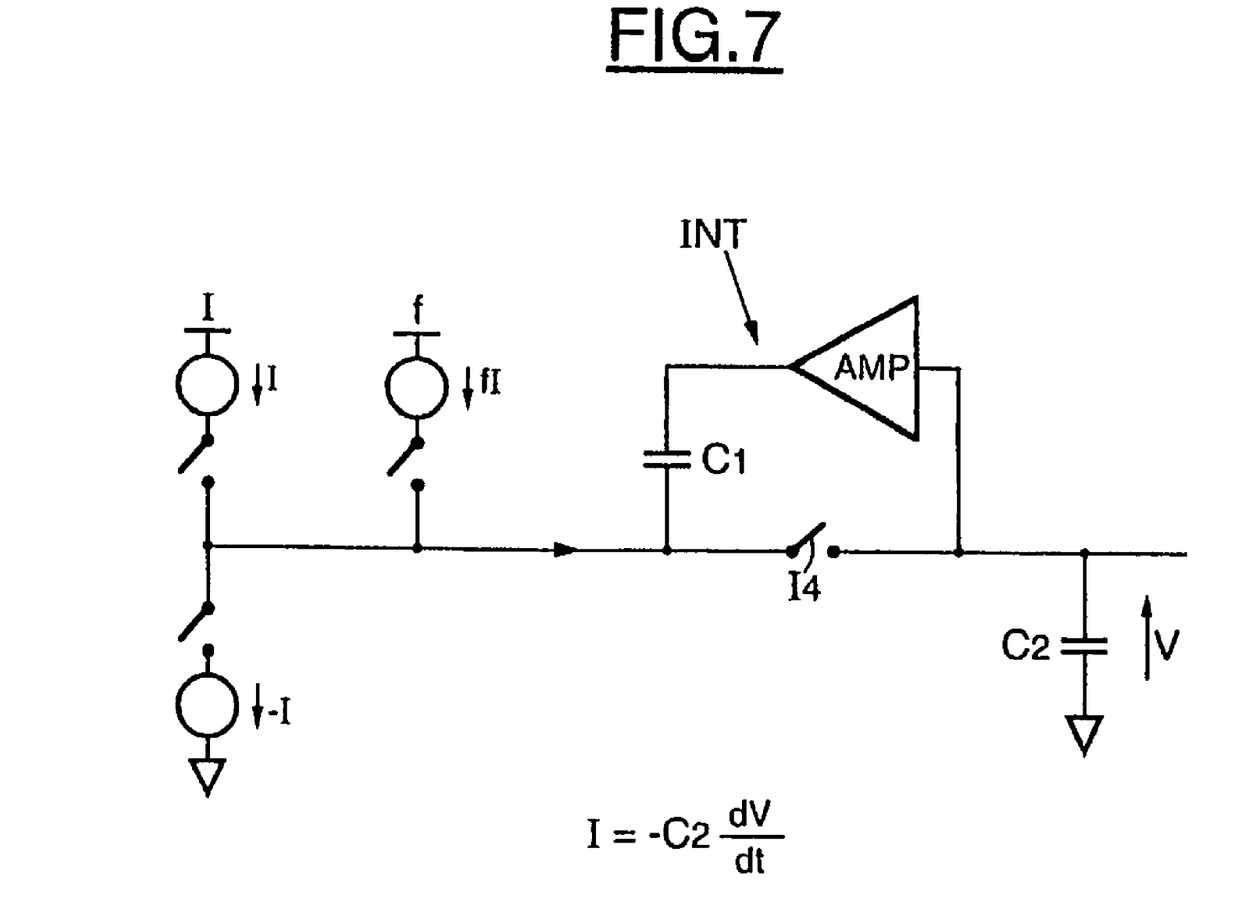
FIG. 7 is a schematic diagram of another embodiment of the integrator used with the device of FIG. 1.

In the embodiment illustrated in FIG. 7, the integrator INT is arranged in a branch parallel to the switch $I_4$, and comprises an amplifier AMP mounted as a voltage follower in series with a capacitor $C_1$. A capacitor $C_2$ is mounted in series between the input of the oscillator VCO and the mid-point voltage $V_{pm}$. The sign of the current is then inverted with respect to the arrangement illustrated in FIG. 1.

Figure 8:
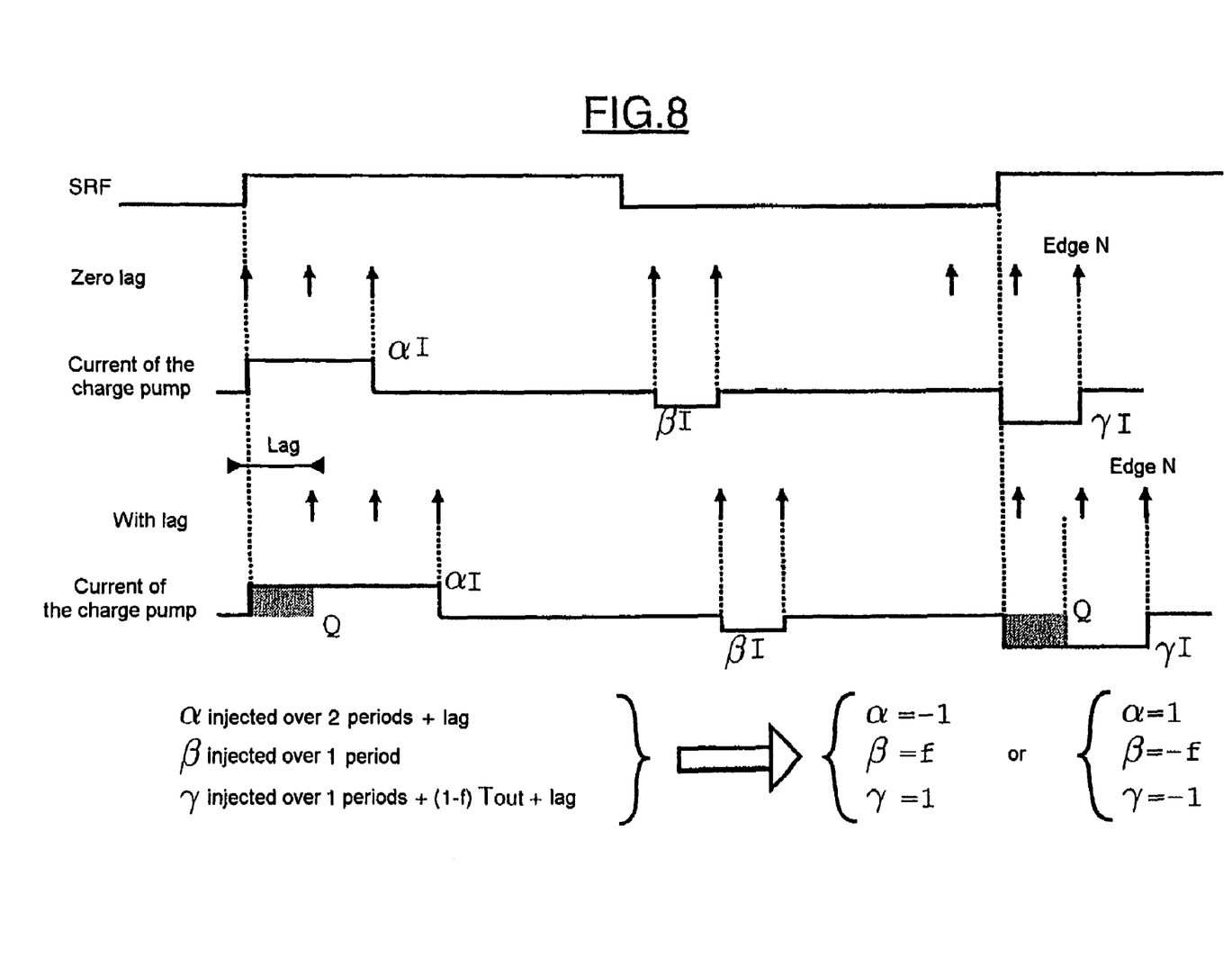
FIGS. 8 is a timing chart illustrating the operation of the device shown in FIG. 1.

In the embodiment illustrated in FIG. 8, the charge pumps $P_1$, $P_3$ and $P_2$ provide currents $\alpha I$, $\beta I$ and $\gamma I$ respectively, in chronological order. Preferably, the absolute values of $\alpha$ and $\gamma$ are similar, or even equal. By way of example, we may have $\alpha=1$, $\beta=-f$ and $\gamma=-1$, or else $\alpha=-1$, $\beta=f$ and $\gamma=1$. The error signal $\Delta V$ may then be written:

$$\Delta V = \frac{I}{C_2}[2\alpha T_{out} + \beta T_{out} + \gamma\{(N+2)T_{out} - T_{ref}\}]$$

with no lag, or with the lags:

$$\Delta V = \frac{I}{C_2}[(2+\delta)\alpha T_{out} + \beta T_{out} + \gamma\{(N+2+\delta)T_{out} - T_{ref}\}]$$

with $\delta$ the cyclic lag.

Thus, the system is capable of performing a frequency multiplication by a real number having a decimal part, retains all the advantages of conventional phase locked loops while eliminating the noise inherent in fractional phase locked loops. The frequency synthesizer applies in particular in the field of remote communication, for example, for a mobile telephone handset, and for Digital Terrestrial Television.

That which is claimed is

1. A method of generating a desired signal having a desired frequency equal to a product of a reference frequency of a reference signal times a real number comprising an integer part and a decimal part, the method comprising:

cyclically performing a succession of a measurement phase and of a correction phase;

the measurement phase comprising an integer division of a frequency of an output signal of an oscillator by a divider so as to obtain an intermediate signal, a determination of measurement signals, responsive to a controller, representative of a time mismatch between the intermediate signal and the reference signal having the reference frequency, and a transfer of electric charge dependent on a reference period of the reference signal, and on the integer part and on the decimal part of the real number so as to obtain an error signal representative of a time mismatch between a current output signal period of the oscillator and a desired period based on the desired frequency of the desired signal;

the correction phase comprising a deactivation of the divider and a correction of the oscillator based on the error signal; and the output signal from the oscillator defining the desired signal.

2. The method according to claim 1 wherein a cycle comprising the measurement phase and the correction phase is performed over an integer number of periods of the reference signal.

3. The method according to claim 1 wherein the correction phase further comprises a deactivation of a charge transfer arising from a transfer unit.

4. The method according to claim 1 wherein the measurement signals successively instruct three transfers of electric charge, one transfer taking place over a duration which is a multiple of a period of the desired output signal, the other transfers taking place over durations dependent on a time mismatch between a current output signal period of the oscillator and the desired period so that an electric current depends on the decimal part of the real number.

5. The method according to claim 4 wherein the transfer of electric charge corresponding to the decimal part of the real number is implemented in the measurement phase.

6. The method according to claim 1 wherein an oscillator correction voltage is generated based upon the charge transferred.

7. A device for generating a desired signal having a desired frequency equal to a product of a reference frequency of a reference signal times a real number comprising an integer part and a decimal part, the device comprising:

an oscillator having a control input and generating an output signal forming the desired signal;

a divider for performing integer division of a frequency of the output signal of said oscillator to obtain a first intermediate signal;

a determination unit for determining output signals representative of a time mismatch between the first intermediate signal and the reference signal having the reference frequency;

a charge transfer unit controlled by the output signals of the determination unit;

a sampler/integrator connected to the charge transfer unit and to the control input of the oscillator; and a controller for controlling the sampler/integrator, deactivating said divider, and controlling the determination unit, to successively determine an error signal and to deliver the error signal to the control input of the oscillator.

8. The device according to claim 1 wherein the sampler/integrator comprises a storage unit storing electric charge transferred by the charge transfer unit, a switch connected to the charge transfer unit, and an integrator connected to the switch and the control input of the oscillator.

9. The device according to claim 8 wherein the controller opens and closes the switch successively and cyclically.

10. The device according to claim 7 wherein the determination unit is synchronized with the reference frequency.

11. The device according to claim 7 wherein the transfer unit comprise a first current source $\alpha I$, a second current source $\beta I$, and a third current source $\gamma I$, that are controlled by three output signals from the determination unit.

12. The device according to claim 11 wherein $\alpha$ is equal to 1 or $-1$, $\beta$ is equal to $-f$ or $+f$, $\gamma$ is equal to $-1$ or 1, respectively, with f being the decimal part of the real number.

13. The device according to claim 11 wherein the second current source comprises a programmable analog to digital converter.

14. The device according to claim 11 wherein the first current source has a steady state that is active during at least two periods of the desired output frequency, the second current source is active during a period of the desired output frequency, and the third current source is active between a reference edge and an Nth output signal edge counting from a ceasing of injection of the first current source $\alpha I$ of the desired output frequency, with f the decimal part of the real number.

15. The device according to claim 7 wherein the device is in a form of an integrated circuit.

16. The device according to claim 7 wherein the device is in a form of a wireless communications device.

17. The device according to claim 15 wherein the wireless communication device comprises one of a cellular mobile telephone and a Digital Terrestrial Television element.

18. A device for generating a desired signal having a desired frequency equal to a product of a reference frequency of a reference signal times a real number comprising an integer part and a decimal part, the device comprising:

an oscillator having a control input and generating an output signal forming the desired signal;

a divider for performing integer division of a frequency of the output signal of said oscillator to obtain a first intermediate signal;

a determination unit for determining output signals representative of a time mismatch between the first intermediate signal and the reference signal having the reference frequency, the determination unit being synchronized with the reference frequency;

a charge transfer unit controlled by the output signals of the determination unit;

a sampler/integrator connected to the charge transfer unit and to the control input of the oscillator;

said sampler/integrator comprising a storage unit storing electric charge transferred by the charge transfer unit, a switch connected to the charge transfer unit, and an integrator connected to the switch and the control input of the oscillator; and a controller for controlling the sampler/integrator, deactivating said divider, and controlling the determination unit, to successively determine an error signal and to deliver the error signal to the control input of the oscillator.

19. The device according to claim 18 wherein the transfer unit comprise a first current source $\alpha I$, a second current source $\beta I$, and a third current source $\gamma I$, that are controlled by three output signals from the determination unit.

20. The device according to claim 19 wherein $\alpha$ is equal to 1 or −1, $\beta$ is equal to −f or +f, $\gamma$ is equal to −1 or 1, respectively, with f being the decimal part of the real number.

21. The device according to claim 19 wherein the second current source comprises a programmable analog to digital converter.

22. The device according to claim 19 wherein the first current source has a steady state that is active during at least two periods of the desired output frequency, the second current source is active during a period of the desired output frequency, and the third current source is active between a reference edge and an Nth output signal edge counting from a ceasing of injection of the first current source $\alpha I$ of the desired output frequency, with f the decimal part of the real number.

23. The device according to claim 18 wherein the device is in a form of an integrated circuit.

24. The device according to claim 18 wherein the device is in a form of a wireless communications device.

* * * * *

UNITED STATES PATENT AND TRADEMARK OFFICE
CERTIFICATE OF CORRECTION

PATENT NO. : 7,501,899 B2  
APPLICATION NO. : 11/312127  
DATED : March 10, 2009  
INVENTOR(S) : Dedieu et al.

Page 1 of 1

It is certified that error appears in the above-identified patent and that said Letters Patent is hereby corrected as shown below:

| | |
|---|---|
| Column 4, Line 32 | Delete: "my"  Insert: --may-- |
| Column 5, Line 10 | Delete: "does may not"  Insert: --may not-- |
| Column 10, Claim 8, Line 4 | Delete: "claim 1"  Insert: --claim 7-- |
| Column 10, Claim 11, Line 14 | Delete: "comprise"  Insert: --comprises-- |
| Column 10, Claim 11, Line 15 | Delete: "$_\gamma I$"  Insert: --$\gamma I$-- |
| Column 11, Claim 19, Line 2 | Delete: "comprise"  Insert: --comprises-- |

Signed and Sealed this

Eighteenth Day of August, 2009

David J. Kappos  
*Director of the United States Patent and Trademark Office*